United States Patent
Gutteridge et al.

[11] Patent Number: 5,914,521
[45] Date of Patent: Jun. 22, 1999

[54] SENSOR DEVICES HAVING A MOVABLE STRUCTURE

[75] Inventors: Ronald James Gutteridge, Paradise Valley; Daniel Nicolas Koury, Jr.; Daniel Joseph Koch, both of Mesa; Jonathan Hale Hammond, Scottsdale, all of Ariz.

[73] Assignee: Motorola, Inc., Schaumburg, Ill.

[21] Appl. No.: 08/903,087

[22] Filed: Jul. 30, 1997

[51] Int. Cl.⁶ ............................................. H01L 29/82
[52] U.S. Cl. .................. 257/415; 257/420; 73/514.15; 73/514.16; 73/514.29; 73/514.32
[58] Field of Search ............................ 257/415, 417, 257/420; 73/514.15, 514.16, 514.27, 514.32

[56] References Cited

U.S. PATENT DOCUMENTS

| | | | |
|---|---|---|---|
| 4,882,933 | 11/1989 | Petersen et al. | 73/517 |
| 5,181,156 | 1/1993 | Gutteridge et al. | 361/283 |
| 5,500,549 | 3/1996 | Takeuchi et al. | 257/415 |
| 5,542,295 | 8/1996 | Howe et al. | 73/514.18 |
| 5,682,053 | 10/1997 | Wiszniewski | 257/401 |

*Primary Examiner*—Ngân V. Ngô
*Attorney, Agent, or Firm*—Kenneth M. Seddon

[57] ABSTRACT

A sensor (11) has a movable plate (16) that moves in response to an external acceleration. The movable plate (16) has a finger (17) that is capacitively coupled to fingers (13,14) that are attached to a substrate (12). A travel stop (19) is used to stop the movable plate (16) before the finger (17) on the movable plate (16) collides into the fingers (13,14) on the substrate (12).

17 Claims, 1 Drawing Sheet

SENSOR DEVICES HAVING A MOVABLE STRUCTURE

BACKGROUND OF THE INVENTION

This invention relates, in general, to semiconductor devices, and more particularly, to sensor devices having a movable structure.

Conventional acceleration sensors typically include a mass that moves in response to the application of external acceleration. The motion is then converted to an electrical response so that the magnitude of the acceleration can be determined. One problem with such structures is that the movable mass can be damaged if too much acceleration is applied.

Bumpers along the outer perimeter of the movable mass is one method for preventing damage that can occur if the movable mass were to move too far. However, bumpers are not ideal in that they consume a significant amount of surface area in the sensor and they can only stop motion along one of two orthogonal axes.

Accordingly, it would be advantageous to provide a sensor structure that is capable of preventing damage to the movable mass of an accelerometer without increasing the size of the sensor.

Figure 1:
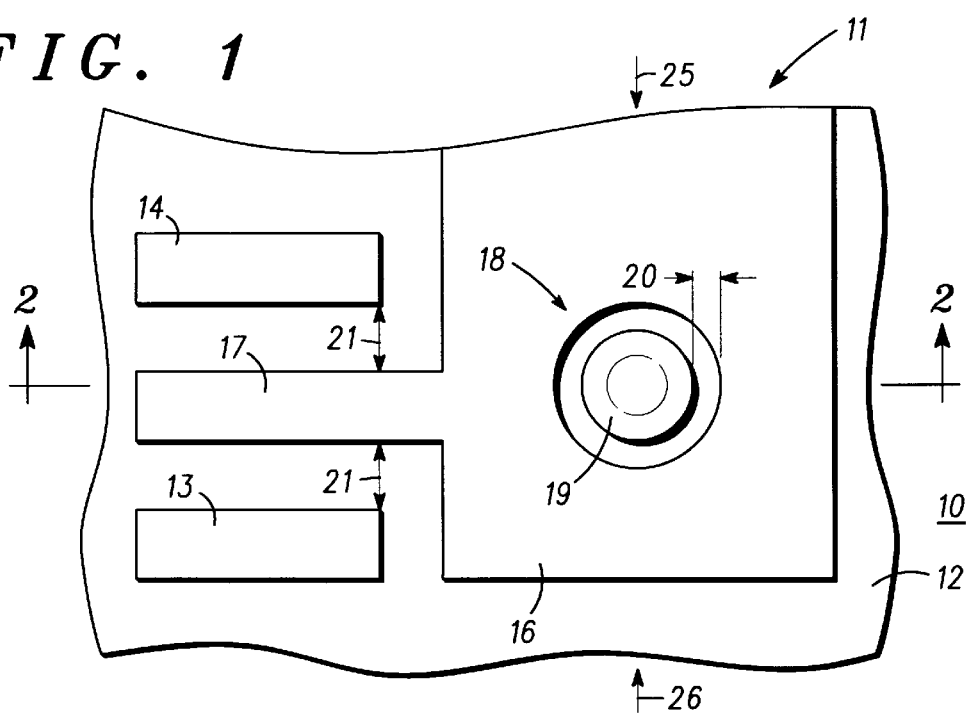
FIG. 1 is an enlarged top view of a portion of a semiconductor device having a sensor formed in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is an enlarged top view of a portion of a semiconductor device 10 formed in accordance with the present invention. More particularly, FIG. 1 illustrates a portion of a sensor or a sensing element 11 of semiconductor device 10. It should be understood that semiconductor device 10 can be an integrated circuit, a microprocessor, a microcontroller, or the like. In addition, semiconductor device 10 can be a discrete sensing device such as a accelerometer, a chemical sensor, microactuator, or a microvalve.

In the example illustrated in FIG. 1, sensing element 11 is an accelerometer that is capable of measuring the magnitude and direction of external acceleration. However, it should also be understood that the present invention in not limited to the applications enumerated above as the present invention can be used with any sensing device that has a moving element.

Sensing element 11 includes a movable plate or a plate 16 that is suspended over a substrate 12 using a conventional means that is known in the art (not shown). Plate 16 defines a plane that is substantially parallel to the surface of the substrate 12 and plate 16 moves within this plane when an external acceleration is applied to semiconductor device 10. Of course, the actual movement of plate 16 within this plane depends on the magnitude and the direction of the force applied to semiconductor device 10 so the movement of plate 16 may not be exactly parallel to the surface of substrate 12.

Sensing element 11 also includes a finger 17 attached to plate 16 and fingers 13–14 that are attached to or supported by substrate 12. Sensing element 11 is formed such that when there is no external acceleration applied to plate 16 (i.e., plate 16 is stationary in its neutral position) finger 17 is separated from fingers 13–14 a predetermined distance indicated in FIG. 1 with arrows 21. Finger 17 is capacitively coupled to fingers 13–14 and is used to provide an electrical signal when plate 16 moves as a result of the application of an external acceleration.

For example, if an external acceleration is applied to semiconductor device 10 in the direction indicated with an arrow 26, plate 16 will move in the direction indicated with an arrow 25 relative to fingers 13–14. This in turn causes finger 17 to move towards finger 13 and away from finger 14. If the external acceleration applied is too great, finger 17 may traverse the entire distance between finger 17 and finger 13 (arrow 21) and collide with finger 13. This can cause structural damage that could make sensing element 11, and thus semiconductor device 10, completely inoperable. Even if permanent damage were not to occur, the contact between finger 17 and finger 13 could create particles that would alter the sensitivity and the performance of sensing element 11.

To prevent finger 17 from contacting fingers 13 or 14, a travel stop 19 is formed so that it passes at least partially through an opening 18 in plate 16. In the preferred embodiment as shown in FIG. 1, both the opening 18 in plate 16 and the edge of travel stop 19 are circular. The edge of travel stop 19 is separated from the edge of opening 18 indicated by an arrow 20 to provide a maximum travel stop distance. For example, travel stop 19 can be separated from the edge of the opening 18 in plate 16 by a distance of less than about 100 microns. In addition this contact could create a temporary electrical short circuit which would interfere with the capacitive coupling of these elements.

The actual distance between travel stop 19 and plate 16 can vary, but it is intended to be less than the distance between finger 17 and fingers 13–14 (arrow 21). This prevents finger 17 from contacting either finger 13 or 14 when a large external acceleration is applied because plate 16 contacts travel stop 19 first, which prevents any further movement of plate 16. Forming travel stop 19 the opening 18 in plate 16 in a circular configuration has several advantages. First, no matter what direction plate 16 moves in, plate 16 has the same maximum travel distance before contacting travel stop 19. Secondly, when plate 16 contacts travel stop 19 it does so at a single point. This minimizes the likelihood that plate 16 will stick to travel stop 19 due to electrostatic or inter-atomic forces and reduces the likelihood that particulates are created upon contact. Finally, the circular configuration allows travel stop 19 to operate in an omnidirectional manner. In other words, travel stop 19 can stop the movement of plate 16 no matter what direction plate 16 moves.

Figure 2:
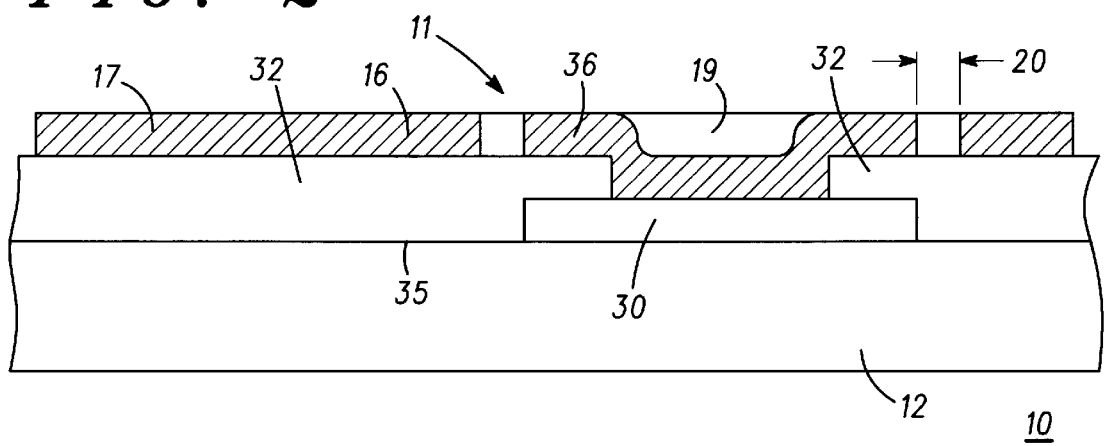
FIG. 2 is an enlarged cross-sectional view of the semiconductor device.

Turning now to FIG. 2, a method of forming sensing element 11 is provided. FIG. 2 is an enlarged cross-sectional view of sensing element 11 taken along section lines 2—2 shown in FIG. 1. To begin, a layer of material (not shown) such as polysilicon is formed over a surface 35 of substrate 12. The material is then patterned to provide a base 30 which acts as a lower portion for travel stop 19. A sacrificial layer 32 is then formed over base 30 and the surface 35 of substrate 12. Sacrificial layer 32 can be a layer of doped silicon dioxide or phosphosilicate silicon glass (PSG) that is deposited using conventional techniques. An opening is then formed in sacrificial layer 32 to expose a portion of base 30 as shown in FIG. 2.

A layer of material such as single-crystal silicon, polysilicon, amorphous silicon, metal, metal silicide, or the like is then formed and patterned as shown in FIG. 2. This material is used to form finger 17, movable plate 16, and the upper portion 36 of travel stop 19. Since travel stop 19 and plate 16 are formed from the same material, they will have a thickness that is substantially equal save for normal variations in the deposition processes. Thus, travel stop 19 can be formed without any additional process steps and without increasing the size of sensing element 11 since travel stop 19 is formed within the surface area of plate 16. After travel stop 19 is patterned, a wet etch process is used to remove sacrificial layer 32 so that plate 16 is free to move.

Figure 3:
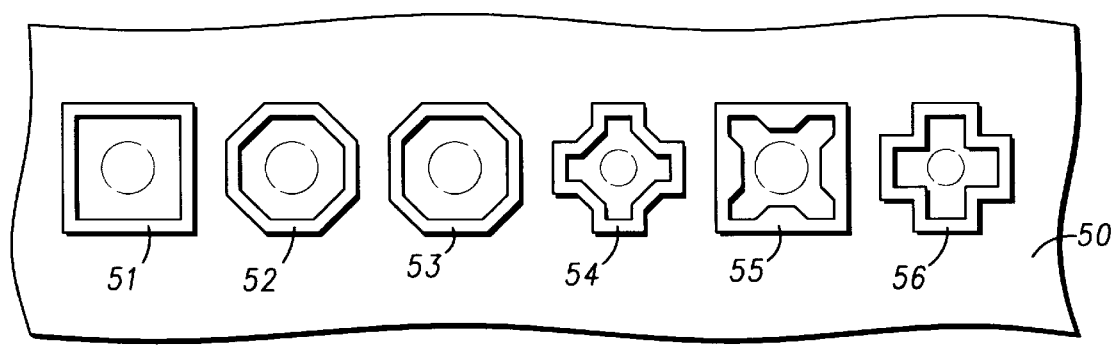
FIG. 3 is an enlarged top view of a sensor illustrating alternate embodiments of forming travel stop in accordance with the present invention.

Referring now to FIG. 3, alternative configurations for forming travel stops 51–56 in accordance with the present invention are provided. Depending on the photolithographic process that is used to pattern the movable plate and travel stops of a sensing element, some alternative shapes for the travel stops may be desirable due to limitations of the manufacturing process. For instance, some photolithographic processes may have a minimum resolution which makes its more difficult to repeatedly form small circular images compared to straight edges. In which case, some of the alternative configurations shown in FIG. 3 may be easier to manufacture, and thus, more desirable.

FIG. 3 is an enlarged top view of a movable plate 50 that has travel tops 51–56. More particularly, travel stop 51 is arranged in a square configuration and travel stop 52 is arranged as an octagon. The patterns defining travel stops 53–56 comprise a plurality of segments, some of which are equal in length, that are arranged in various cross-like patterns. Each of travel stops 51–56 may be the most desirable depending on the critical dimension (CD) limitations of the photolithographic and etch processes used to form a semiconductor device in accordance with the present invention. It should be understood that a sensing element can be formed such that is has a plurality of travel stops arranged across the movable plate so that damage from rotational motion can be prevented.

By now it should be appreciated that the present invention provides a sensor structure and method for making the same that prevents damage when too great of an external acceleration is applied to the sensor. The use of travel stops in accordance with the present invention are more reliable, omnidirectional, and less expensive to manufacture than other structures known in the art.

We claim:

1. A semiconductor device comprising:
   a substrate having a surface;
   a movable plate overlying the substrate, wherein the movable plate has a opening; and
   a travel stop contacting the substrate and passing through at least a portion of the opening in the movable plate.

2. The semiconductor device of claim 1 wherein the movable plate defines a plane that is substantially parallel to the surface of the substrate.

3. The semiconductor device of claim 1 wherein the movable plate comprises a material selected from a group consisting of single-crystal silicon, polysilicon, amorphous silicon, metal, and metal silicide.

4. The semiconductor device of claim 1 wherein the travel stop comprises:
   a first portion contacting the surface of the substrate; and
   a second portion overlying the first portion, wherein the movable plate is made from a same material as the second portion of the travel stop.

5. The semiconductor device of claim 4 wherein the second portion of the travel stop has a thickness that is substantially equal to the thickness of the movable plate.

6. The semiconductor device of claim 1 further comprising:
   a first finger overlying the substrate; and
   a second finger attached to the movable plate, wherein the first finger and the second finger are separated by a first distance when the movable plate is stationary.

7. The semiconductor device of claim 6 wherein the travel stop has an edge that is separated from the movable plate by a second distance, and the first distance is greater than the second distance.

8. The semiconductor device of claim 7 wherein the first distance is less than about 100 microns.

9. The semiconductor device of claim 1 wherein the opening in the movable plate and the travel stop are substantially circular.

10. The semiconductor device of claim 1 wherein the travel stop has an edge comprising a plurality of segments and each of the plurality of segments is substantially equal in length.

11. The semiconductor device of claim 10 wherein the plurality of segments includes at least six segments.

12. The semiconductor device of claim 10 wherein the plurality of segments is configured as an octagon.

13. The semiconductor device of claim 1 wherein the travel stop retards movement of the movable plate in an omnidirectional manner.

14. A sensor comprising:
   a substrate;
   a plate overlying the substrate, wherein the plate has an opening;
   a first finger connected to the substrate;
   a second finger connected to the plate, wherein the first finger and the second finger are separated by a first distance; and
   a travel stop overlying the substrate and passing through at least a portion of the opening in the plate, wherein the travel stop is separated from the plate by a second distance, the second distance being less than the first distance.

15. The sensor of claim 14 wherein at least a portion of the travel stop is made from a same material as the plate.

16. The sensor of claim 15 wherein at least a portion of the travel stop is made from polysilicon, and the travel stop and the opening in the plate are substantially circular.

17. The sensor of claim 14 wherein the plate has a plurality of holes, and the sensor has a plurality of travel stops with one of the plurality of travel stops in each of the plurality of holes.

* * * * *